US008597722B2

United States Patent
Albano et al.

(10) Patent No.: US 8,597,722 B2
(45) Date of Patent: *Dec. 3, 2013

(54) METHOD FOR MANUFACTURE AND STRUCTURE OF MULTIPLE ELECTROCHEMISTRIES AND ENERGY GATHERING COMPONENTS WITHIN A UNIFIED STRUCTURE

(75) Inventors: Fabio Albano, Ann Arbor, MI (US); Chia Wei Wang, Ypsilanti, MI (US); Ann Marie Sastry, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 5 days.

This patent is subject to a terminal disclaimer.

(21) Appl. No.: 13/465,243

(22) Filed: May 7, 2012

(65) Prior Publication Data
US 2012/0219830 A1 Aug. 30, 2012

Related U.S. Application Data

(63) Continuation of application No. 12/614,169, filed on Nov. 6, 2009, now Pat. No. 8,192,789.

(60) Provisional application No. 61/112,707, filed on Nov. 7, 2008.

(51) Int. Cl.
*B05D 5/12* (2006.01)
*C23C 14/00* (2006.01)
*H01M 6/00* (2006.01)

(52) U.S. Cl.
USPC ......... 427/115; 427/486; 29/623.1; 29/623.5; 204/192.15; 204/192.18

(58) Field of Classification Search
USPC ................ 427/115, 466; 204/192.15, 192.18; 29/623.1, 623.5; 429/40–44
See application file for complete search history.

(56) References Cited

U.S. PATENT DOCUMENTS 6,083,637 A 7/2000 Walz et al.
6,650,000 B2 11/2003 Ballantine et al.
(Continued)

FOREIGN PATENT DOCUMENTS

CN 1619876 A 5/2005

OTHER PUBLICATIONS

International Search Report and Written Opinion of PCT Application No. PCT/US2009/063571, date of mailing Dec. 29, 2009, 12 pages total.

(Continued)

*Primary Examiner* — Brian K Talbot
(74) *Attorney, Agent, or Firm* — Richard T. Ogawa; Ogawa P.C.

(57) ABSTRACT

A method for using an integrated battery and device structure includes using two or more stacked electrochemical cells integrated with each other formed overlying a surface of a substrate. The two or more stacked electrochemical cells include related two or more different electrochemistries with one or more devices formed using one or more sequential deposition processes. The one or more devices are integrated with the two or more stacked electrochemical cells to form the integrated battery and device structure as a unified structure overlying the surface of the substrate. The one or more stacked electrochemical cells and the one or more devices are integrated as the unified structure using the one or more sequential deposition processes. The integrated battery and device structure is configured such that the two or more stacked electrochemical cells and one or more devices are in electrical, chemical, and thermal conduction with each other.

15 Claims, 4 Drawing Sheets

(56) References Cited

U.S. PATENT DOCUMENTS

| | | |
|---|---|---|
| 6,664,786 B2 | 12/2003 | Kretschmann et al. |
| 7,150,931 B1 | 12/2006 | Jaffrey |
| 2003/0044662 A1 | 3/2003 | Walsh |
| 2004/0185310 A1 | 9/2004 | Jenson et al. |
| 2005/0073314 A1 | 4/2005 | Bertness et al. |
| 2005/0258801 A9 | 11/2005 | Johnson et al. |
| 2006/0038536 A1 | 2/2006 | LaFollette et al. |
| 2006/0055175 A1 | 3/2006 | Grinblat |
| 2007/0190418 A1 | 8/2007 | Chiang et al. |
| 2010/0196744 A1 | 8/2010 | Tucholski et al. |

OTHER PUBLICATIONS

Office Action and List of References for U.S. Appl. No. 12/614,169 mailed Dec. 2, 2010 from the United States Patent and Trademark Office.

Office Action and List of References for U.S. Appl. No. 12/614,169 mailed Mar. 11, 2011 from the United States Patent and Trademark Office.

Office Action and List of References for U.S. Appl. No. 12/614,169 mailed Oct. 27, 2011 from the United States Patent and Trademark Office.

Office Action for China Patent Application No. 2009/80144551.2 dated Sep. 27, 2012.

METHOD FOR MANUFACTURE AND STRUCTURE OF MULTIPLE ELECTROCHEMISTRIES AND ENERGY GATHERING COMPONENTS WITHIN A UNIFIED STRUCTURE

CROSS-REFERENCES TO RELATED APPLICATIONS

This application is a continuation of U.S. application Ser. No. 12/614,169 filed on Nov. 6, 2009, which claims priority to U.S. Provisional Patent Application No. 61/112,707, filed on Nov. 7, 2008, entitled "Method for manufacture and structure of multiple electrochemistries and energy gathering components within a unified structure," the disclosure of which is hereby incorporated by reference in its entirety for all purposes.

SUMMARY OF THE INVENTION

According to the present invention, techniques related to energy devices are provided. More particularly, embodiments of the present invention relate to methods to design, manufacture, and structure a multi-component energy device having a unified structure. The individual components can include electrochemical cells, photovoltaic cells, fuel-cells, capacitors, ultracapacitors, thermoelectric, piezoelectric, micro electromechanical turbines, or energy scavengers. The methods and systems described herein are also applicable to a variety of energy systems.

According to an embodiment of the present invention, a method for using an integrated battery and device structure is provided. The method includes using two or more stacked electrochemical cells integrated with each other formed overlying a surface of a substrate. The two or more stacked electrochemical cells include related two or more different electrochemistries with one or more devices formed using one or more sequential deposition processes. The one or more devices are integrated with the two or more stacked electrochemical cells to form the integrated battery and device structure as a unified structure overlying the surface of the substrate. The one or more stacked electrochemical cells and the one or more devices are integrated as the unified structure using the one or more sequential deposition processes. The integrated battery and device structure is configured such that the two or more stacked electrochemical cells and one or more devices are in electrical, chemical, and thermal conduction with each other.

Numerous benefits are achieved by way of the present invention over conventional techniques. For example, electrochemical cells described herein present multiple chemistries to accommodate a wider range of voltage and current compared to individual ones. Additionally, energy-scavenging elements are utilized to collect energy and replenish it to other components within the unified structure. Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF SPECIFIC EMBODIMENTS

Example 1

A Unified Structure Including a Silicon (Si) Solar Cell and a Thin Film Battery and their Manufacturing Method.

Figure 1:
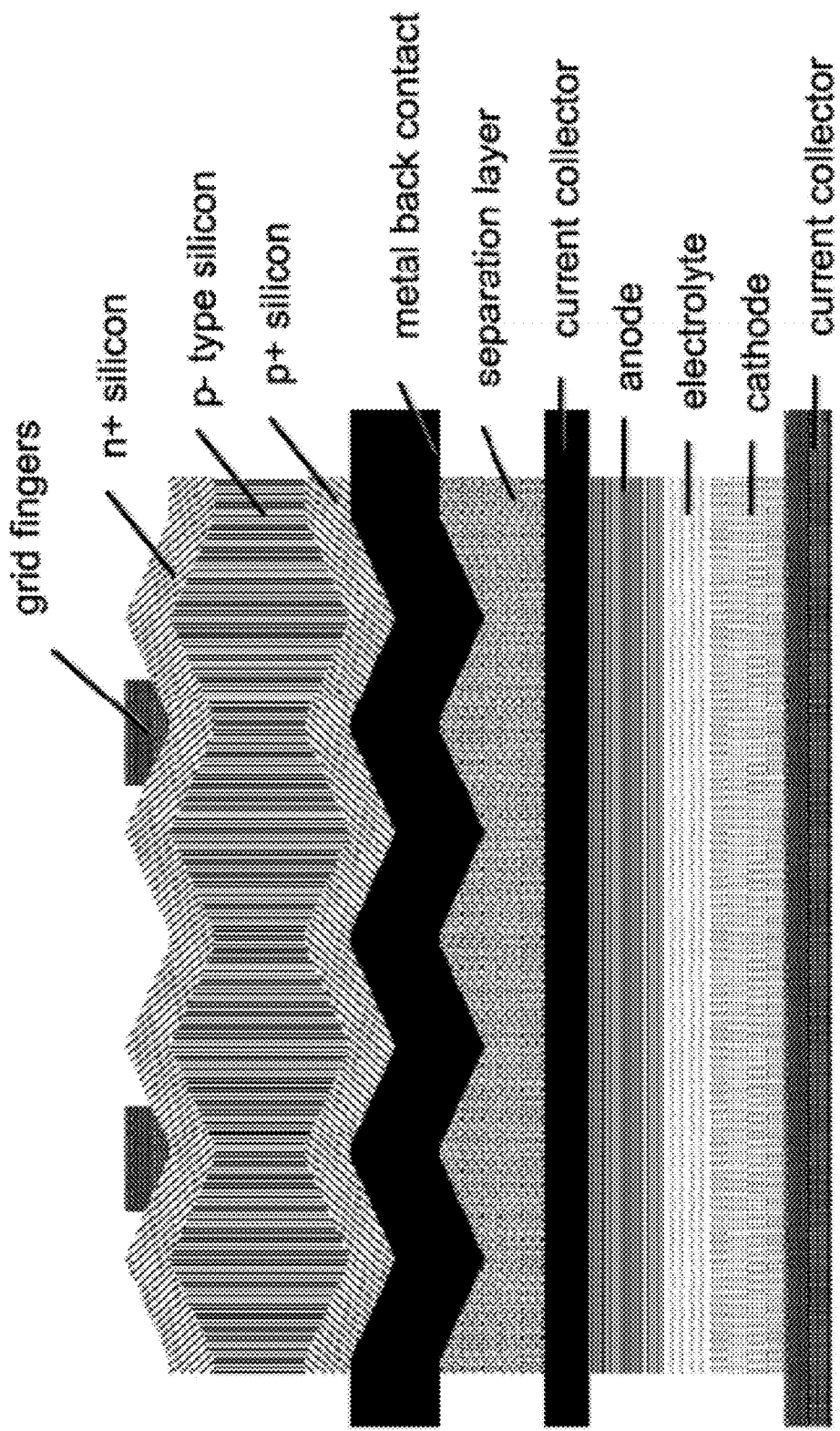
FIG. 1—Simplified cross-sectional view of a unified structure including an integrated silicon (Si) solar cell and a thin film battery.

Preparing a stacked cell on the back surface of a silicon (Si) solar cell as shown in FIG. 1 can be achieved by forming the cell components using physical vapor deposition. A solar cell exploiting p-type silicon is constructed using traditional Si wafers (Czochralski method). After forming a p-n junction by diffusing phosphorous (P) into the wafer, an aluminum (Al) back contact is created (metal back contact in FIG. 1), onto the p+ doped region (lower side) of the silicon wafer, using physical vapor deposition. The aluminum layer is grown to a thickness of 1-2 µm.

After the back metal contact is created, a separation layer of electrically insulating and thermally conductive aluminum nitride (AlN), having a thickness of 3-5 µm, is fabricated onto the aluminum layer using PVD. This layer has the function of removing heat from the two elements and convey it to a heat sink.

After the cooling element is completed, the battery components are deposited sequentially and conformally by a physical vapor deposition (PVD) process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick), and a copper (Cu) current collector layer (1-3 µm thick), respectively.

Example 2

A Unified Structure Including Two Thin Film Batteries Having Different Chemistry and their Manufacturing Method.

Figure 2:
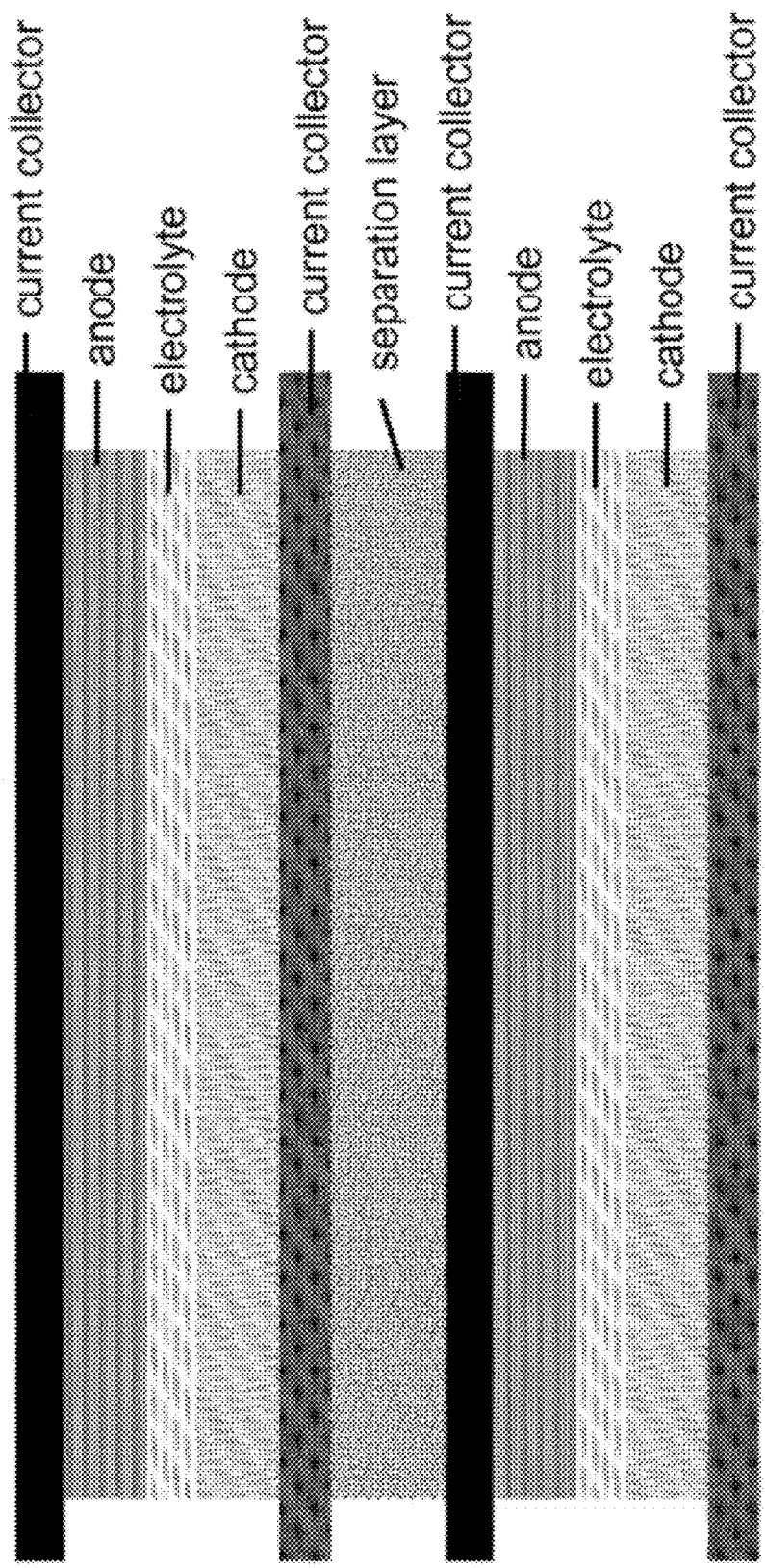
FIG. 2—Simplified cross-sectional view of a unified structure including two integrated thin film batteries having different chemistry.

Two stacked cells having different electrochemistries are fabricated onto each other by using physical vapor deposition as reported in FIG. 2.

The first battery components are deposited using a PVD process onto an aluminum (Al) metal film used as cathode current collector: a lithium iron phosphate ($LiFePO_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

After the copper (Cu) metal current collector is created, a separation layer of electrically insulating and thermally conductive aluminum nitride (AlN), having a thickness of 3-5 µm, is fabricated onto the copper layer using PVD. This layer has the function of removing heat from the two elements and convey it to a heat sink.

After the cooling element is completed, the second battery components are deposited sequentially and conformally by a PVD process: an aluminum (Al) current collector layer (1-3

μm thick), a lithium manganese oxide (LiMn$_2$O$_4$) cathode layer (3-5 μm thick), a lithium phosphorous oxynitride (LIPON) ceramic electrolyte layer (1-3 μm thick), a lithium (Li) metal anode layer (3-5 μm thick) and a copper (Cu) current collector layer (1-3 μm thick), respectively.

Example 3

A Unified Structure Including a Fuel-Cell and a Thin Film Battery and their Manufacturing Method.

Figure 3:
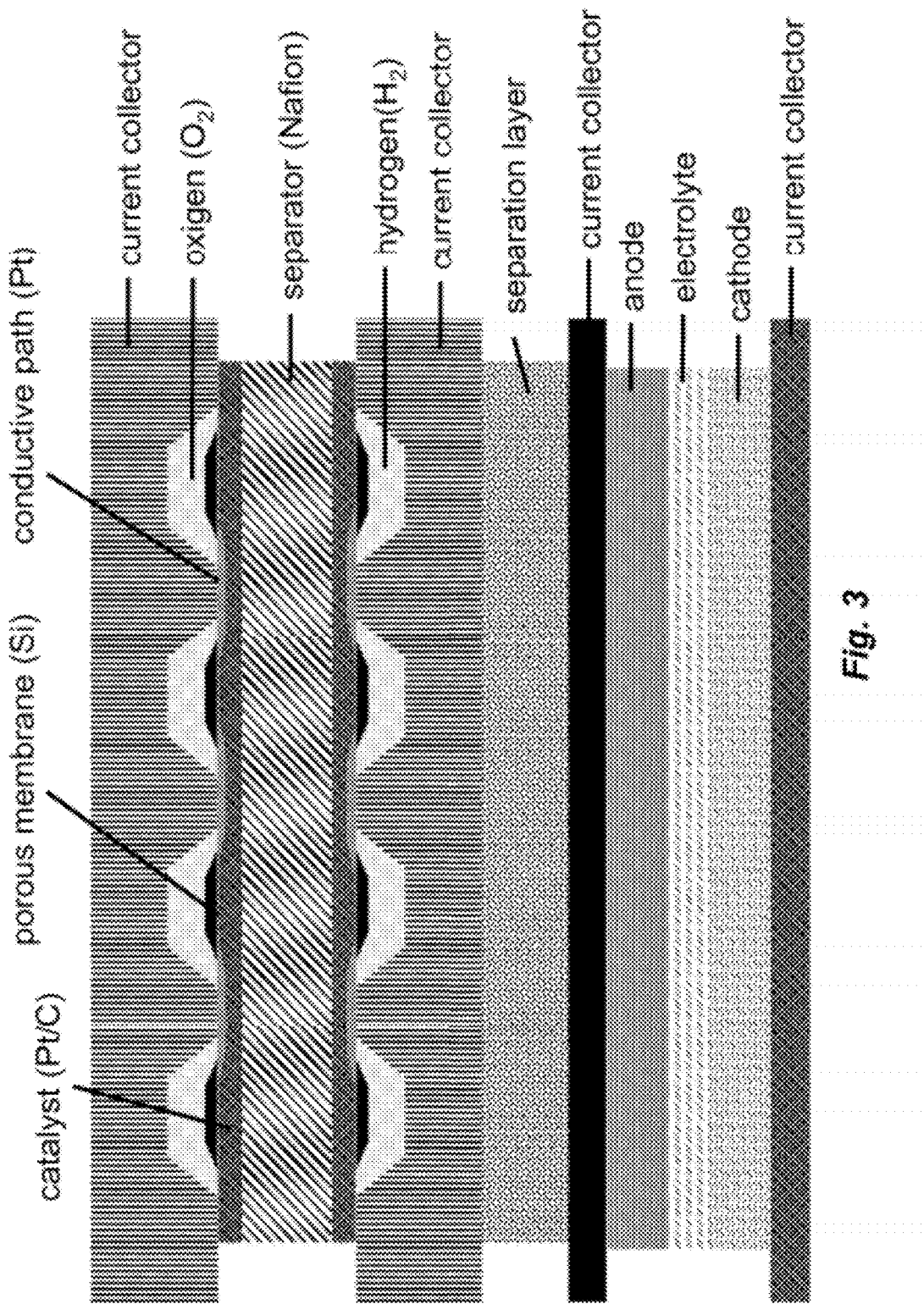
FIG. 3—Simplified cross-sectional view of a unified structure including an integrated hydrogen/oxygen fuel-cell and a thin film battery.

Preparing a stacked cell on the back surface of a proton-exchange membrane (PEM) fuel-cell as shown in FIG. 3 can be achieved by forming the cell components using physical vapor deposition (PVD). A PEM fuel-cell exploiting proton exchange membranes with high proton conductivity, employing perfluorosulfonate ionomers electrolytes such as Nafion®, is constructed using traditional sol-gel methods for fabricating the membrane and wet slurry for the electrodes.

After assembly of the fuel-cell a separation layer of electrically insulating and thermally conductive aluminum nitride (AlN), having a thickness of 3-5 μm, is fabricated onto the fuel-cell current collector using PVD. This layer has the function of removing heat from the two elements and conveying it to a heat sink.

After the cooling element is completed, the battery components are deposited sequentially and conformally by a PVD process. Respectively an aluminum (Al) current collector layer (1-3 μm thick), a lithium manganese oxide (LiMn$_2$O$_4$) cathode layer (3-5 μm thick), a lithium phosphorous oxynitride (LIPON) ceramic electrolyte layer (1-3 μm thick), a lithium (Li) metal anode layer (3-5 μm thick) and a copper (Cu) current collector layer (1-3 μm thick).

Example 4

A Unified Structure Including an Ultra-Capacitor and a Thin Film Battery and their Manufacturing Method.

Preparing a stacked cell on the back surface of an electrochemical double layer capacitor (EDLC), which is also known as an ultra-capacitor) as shown in FIG. 3 can be achieved by forming the cell components using PVD. In such a hybrid system, the battery provides high energy density while the EDLC enables high power capability in the system.

Figure 4:
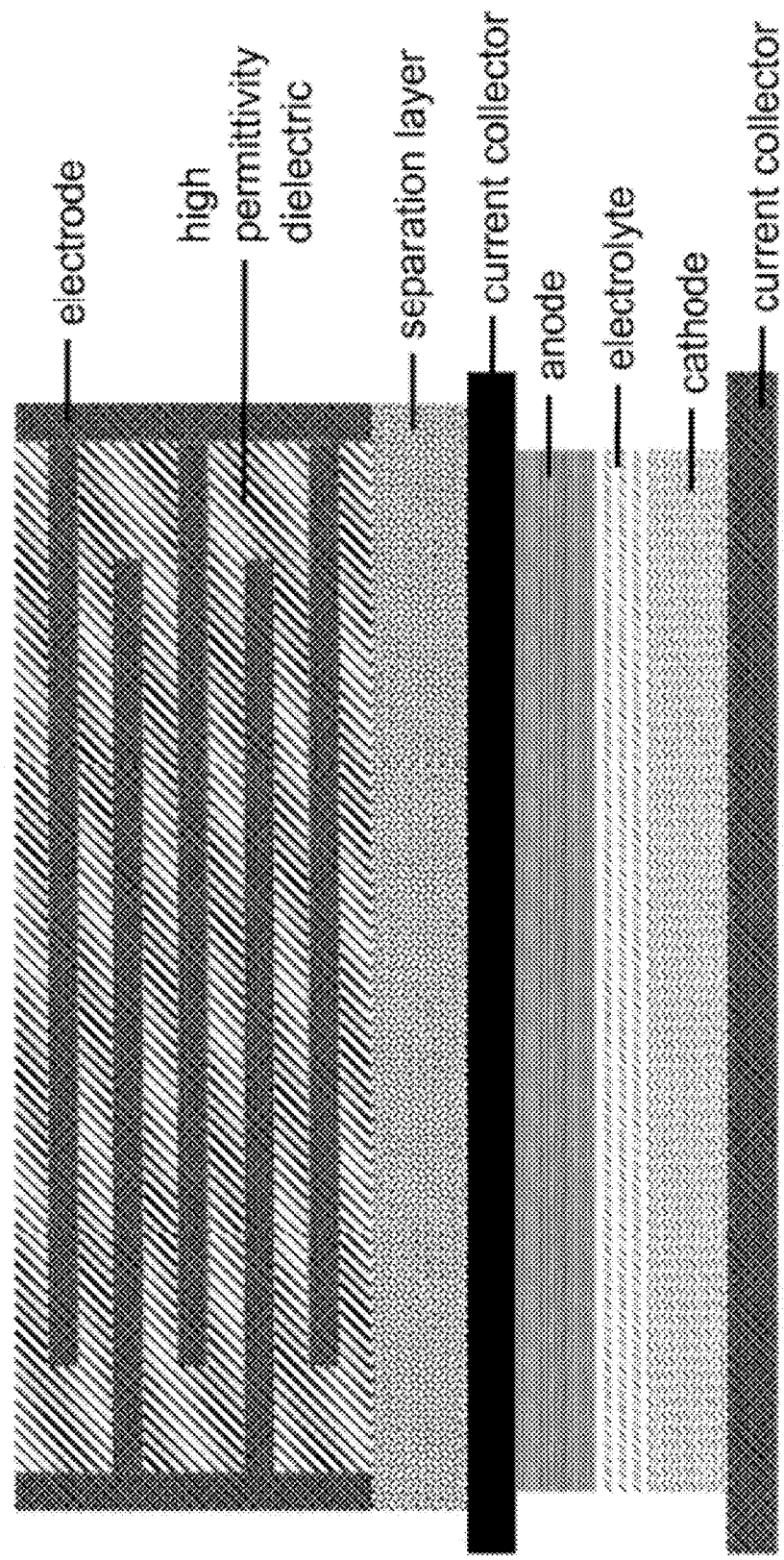
FIG. 4—Simplified cross sectional view of a unified structure including an integrated ultra-capacitor and a thin film battery.

EDLCs describe a class of energy-storage devices that incorporate active materials including high-surface-area carbons (activated carbons), electroactive polymers, transition metal oxides and nitrides. The separation materials include advanced dielectrics, conventional and advanced polymer electrolytes and ionic conducting materials. Electrodes arrangement can be symmetric or anti-symmetric. In FIG. 4 an anti-symmetric electrode arrangement is presented for the device electrodes. The electrodes of the capacitor can be formed by high-surface-area materials such as activated carbon of high capacitance redox-active materials such as metal oxides (e.g. hydrous ruthenium oxides, RuO$_2$.0.5H$_2$O) prepared by sol-gel methods with capacitance up to 700 F/g. Using anti-symmetric electrodes and different anode and cathode materials resulting in higher working voltages enhances the energy-storage capability of this element.

After assembly of the ultra-capacitor a separation layer of electrically insulating and thermally conductive aluminum nitride (AlN), having a thickness of 3-5 μm, is fabricated onto the dielectric material layer using PVD. This layer has the function of removing heat from the two elements and conveying it to a heat sink.

After the cooling element is completed, the battery components are deposited sequentially and conformally by a PVD process: an aluminum (Al) current collector layer (1-3 μm thick), a lithium manganese oxide (LiMn$_2$O$_4$) cathode layer (3-5 μm thick), a lithium phosphorous oxynitride (LIPON) ceramic electrolyte layer (1-3 μm thick), a lithium (Li) metal anode layer (3-5 μm thick) and a copper (Cu) current collector layer (1-3 μm thick), respectively.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for using an integrated battery and device structure, the method comprising:
    using two or more stacked electrochemical cells integrated with each other formed overlying a surface of a substrate, the two or more stacked electrochemical cells comprising related two or more different electrochemistries with one or more devices formed using one or more sequential deposition processes, the one or more devices being integrated with the two or more stacked electrochemical cells to form the integrated battery and device structure as a unified structure overlying the surface of the substrate,
    whereupon the one or more stacked electrochemical cells and the one or more devices are integrated as the unified structure using the one or more sequential deposition processes, and
    wherein the integrated battery and device structure is configured such that the two or more stacked electrochemical cells and one or more devices are in electrical, chemical, and thermal conduction with each other.

2. The method of claim 1 wherein the one or more sequential deposition processes is one of at least physical vapor deposition (PVD).

3. The method of claim 1 further comprising a separation region configured for heat transfer provided between the two or more electrochemical cells.

4. The method of claim 3 wherein the separation region configured for thermal transfer is formed from at least diamond (C), poly-diamond (poly-C), alumina, boron nitride, aluminum nitride, or silicon carbide.

5. The method of claim 1 wherein the two or more electro-chemistries selected from at least lithium (Li), lithium-ion, lithium-metal-polymer (LiM-polymer), lithium (Li)-air, lead (Pb)-acid, nickel metal hydrate (Ni/MH), nickel-zinc (Ni/Zn), zinc (Zn)-air, molten salts (Na/NiCl2), zebra (NaAlCl4), nickel-cadmium (Ni/Cd), silver-zinc (Ag/Zn).

6. The method of claim 1 wherein the device comprises at least one of a microelectromechanical system (MEMS) sensing element, a fuel-cell, a photovoltaic device, a capacitor, or an ultracapacitor.

7. The method of claim 1 wherein the device comprises a hybrid combination of units selected from the group consisting of electrochemical cells, fuel-cells, photovoltaic cells, capacitors, ultracapacitors, piezoelectric, thermo-electric, microelectromechanical turbines and energy scavengers.

8. The method of claim 1 further comprising a monitoring device consisting of a data BUS in logic contact and communication with the one or more devices and a central computing and processing unit (CPU), the CPU having control over one or more individual elements.

9. The method of claim 8 wherein the monitoring device is configured to detect temperature T.

10. The method of claim 9 wherein the monitoring device is configured to detect stress within one or more components.

11. The method of claim 9 wherein the monitoring device is configured to detect gas and gaseous reaction by products from operation at least either the one or more electrochemical cells or one or more devices.

12. The method of claim 9 wherein the monitoring device is configured to detect lithium composition and a transition through an anode and a cathode separation layer.

13. The method of claim 9 further comprising one or more monitoring devices to maintain a safe operation of the two or more electrochemical cells or the one or more devices.

14. The method of claim 1 further comprising a cooling system consisting of liquid coolant or liquefied gases activated if temperature rises above a set threshold, the cooling system being in thermal contact with heat sinks designed to remove thermal energy using one or more conducting paths.

15. The method of claim 1 wherein the two or more electrochemical cells are configured using hybrid principles applied to optimize device architecture, schedule, energy and power density along with rechargeability and lifetime.

\* \* \* \* \*